US007666688B2

(12) United States Patent
Ching et al.

(10) Patent No.: US 7,666,688 B2
(45) Date of Patent: Feb. 23, 2010

(54) METHOD OF MANUFACTURING A COIL INDUCTOR

(75) Inventors: Kai-Ming Ching, Jhudong Township, Hsinchu County (TW); Chen-Shien Chen, Shin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 76 days.

(21) Appl. No.: 12/019,688

(22) Filed: Jan. 25, 2008

(65) Prior Publication Data

US 2009/0188104 A1 Jul. 30, 2009

(51) Int. Cl.
*H01L 21/02* (2006.01)

(52) U.S. Cl. .................... 438/3; 438/381; 257/E21.022

(58) Field of Classification Search ........... 257/E21.022
See application file for complete search history.

(56) References Cited

U.S. PATENT DOCUMENTS 6,291,305 B1 * 9/2001 Huang et al. ................ 438/381
6,614,093 B2 * 9/2003 Ott et al. ..................... 257/531
7,417,525 B2 * 8/2008 Lee et al. .................... 336/200
2002/0050626 A1 * 5/2002 Onuma et al. ............... 257/531
2002/0097129 A1 * 7/2002 Johnson ...................... 336/200
2003/0122647 A1 * 7/2003 Ou ............................. 336/200
2004/0004266 A1 * 1/2004 Furumiya et al. ........... 257/528
2004/0104449 A1 * 6/2004 Yoon et al. .................. 257/528

* cited by examiner

*Primary Examiner*—Stephen W Smoot
(74) *Attorney, Agent, or Firm*—Thomas, Kayden, Horstmeyer & Risley

(57) ABSTRACT

A method of manufacturing a coil inductor and a coil inductor are provided. A plurality of conductive bottom structures are formed to be lying on a first dielectric layer. A plurality pairs of conductive side structures are then formed, wherein each pair of the conductive side structure stand on top surface of a first end and a second end of each conductive bottom structure respectively; a second dielectric layer is formed on the first dielectric layer, coating the bottom and side structures; and a plurality of conductive top structures are formed to be lying on the second dielectric layer, wherein each conductive top structure electrically connects each pair of the conductive side structures, wherein the conductive bottom structures, the conductive side structures and the conductive top structures together form a conductive coil structure.

20 Claims, 9 Drawing Sheets

METHOD OF MANUFACTURING A COIL INDUCTOR

BACKGROUND

1. Field of Invention

The present invention relates to a coil inductor. More particularly, the present invention relates to a method of manufacturing a coil inductor to reduce energy loss in the substrate.

2. Description of Related Art

Traditional inductors fabricated on silicon substrate are provided by coils of conductive material formed on the substrate. The coil of conductive material may be formed in a spiral structure as a spiral inductor in dielectric film. As illustrated in FIG. 1, a top view of a spiral inductor, the traditional spiral inductor is a spiral structure with the inductor coil 102 flatly laid out on the substrate surface 104. The two ends 106, 108 of the coil 102 may be electrically connected to conductive pads, respectively. The current flows through the inductor coil 102 introducing an inductance L and a quality factor Q. The current through the inductor coil also induces a small current known as the Eddy current flowing in the substrate.

Eddy current can be viewed as wasted power dissipation in the substrate. This creates an energy loss to the inductor, which then lowers the Q of the inductor degrading its performance. The Q factor is defined as the ratio of the energy stored in the inductor and the power loss by the inductor. Therefore, when more power loss is generated by the Eddy current, the more it reduces the Q. Thus, a design challenge for inductors manufactured on silicon substrates has often been of how to reduce the generation of Eddy current.

For the forgoing reasons, there is a need for an inductor structure having a large quality factor inducing less Eddy current in the silicon substrate.

SUMMARY

The present invention is directed to a method of manufacturing a coil inductor, that it satisfies this need of reducing Eddy current generated by the inductor in the silicon substrate.

The present invention provides a method of manufacturing a conductive coil inductor, wherein the conductive coil inductor is a solenoid, the method comprises the steps of: forming a plurality of conductive bottom structures lying on a first dielectric layer; forming a plurality pairs of conductive side structures, wherein each pair of the conductive side structure stand on top surface of a first end and a second end of each conductive bottom structure respectively; forming a second dielectric layer on the first dielectric layer, coating the bottom and side structures; and forming a plurality of conductive top structures lying on the second dielectric layer, wherein each conductive top structure electrically connects each pair of the conductive side structure, wherein the conductive bottom structures, the conductive side structures and the conductive top structures together form a conductive coil structure It is another an objective of the present invention to provide a method of manufacturing a conductive coil inductor, wherein the conductive coil inductor is a spiral structure, the method comprises the steps of: forming a photo-resist layer on top of a first dielectric layer; patterning the photo-resist layer to form a spiral pattern; plating a conductive spiral layer on top of the first dielectric layer according to the patterned photo-resist layer; removing the photo-resist layer; and forming a ferromagnetic core at the center of the conductive spiral structure.

It is yet another objective of the present invention to provide a coil inductor comprising: a silicon substrate; a first dielectric layer; on the silicon substrate; a conductive coil structure on the first dielectric layer and a second dielectric layer on the first dielectric layer. The conductive coil inductor is a solenoid, the conductive coil inductor comprises: a plurality of conductive bottom structures formed in one direction on the first dielectric layer; a plurality of conductive side structures on a first end and a second end of each conductive bottom structure; and a plurality of conductive top structures on the conductive side structures, wherein each conductive top structure connects the first end of a conductive side structure and the second end of a neighboring conductive side structure; The second dielectric layer coats the conductive bottom structure and the conductive side structure, wherein the conductive top structure is exposed on the second dielectric layer.

Another object of the present invention is to provide a coil inductor comprising: a silicon substrate; a first dielectric layer; on the silicon substrate; a conductive coil structure on the first dielectric layer, wherein the conductive coil inductor is a spiral; and a ferromagnetic core inserted into the axis of the conductive coil structure.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
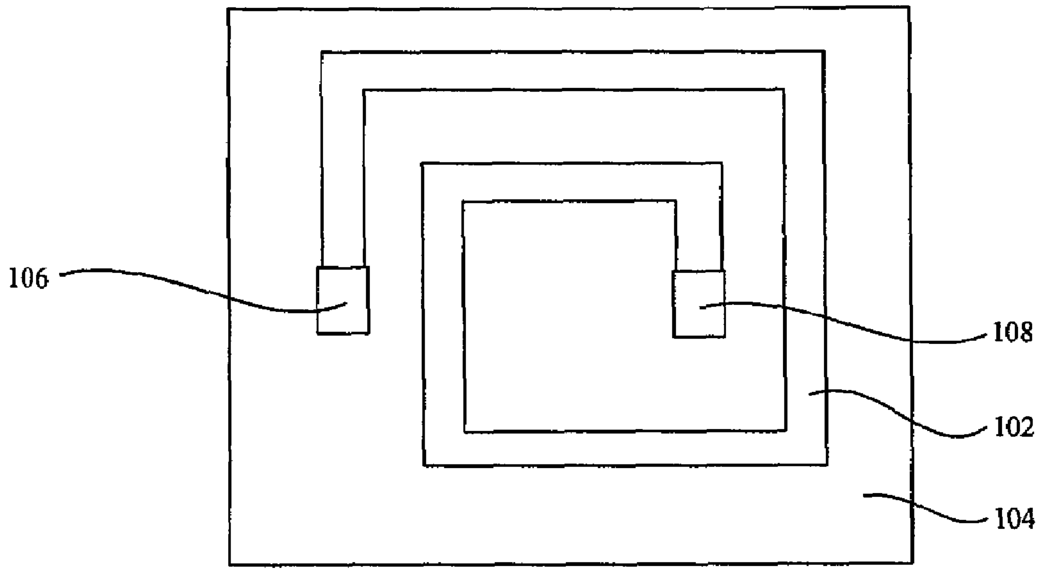
Fig. 1 (Prior Art)
FIG. 1 is a top view of a traditional spiral inductor.

Reference will now be made in detail to the present preferred embodiments of the invention, examples of which are illustrated in the accompanying drawings. Wherever possible, the same reference numbers are used in the drawings and the description to refer to the same or like parts.

In general, the electric field intensity experienced by a material near an inductor is inversely proportional to the distance between the inductor and the material. From Maxwell's equations, one may derive the relationship between the inductor having charged particles and the distance to the electric field evaluation point being inversely proportional. The relationship may be easily derived assuming the inductor is operating at a low frequency and the electric field evaluation point is in a non-conductive material. When the inductor is operating under a high frequency and the electric field point of operation is in a conductive material, such as in a silicon substrate, the derivation may be more complex. However, regardless of the frequency of operation or the conductivity of the material, when an object is further away from a charged particle, the less magnetic field the object experiences. Thus, by increasing the distance between a conductive coil inductor and the substrate, less Eddy current will develop in the substrate.

Figure 2:
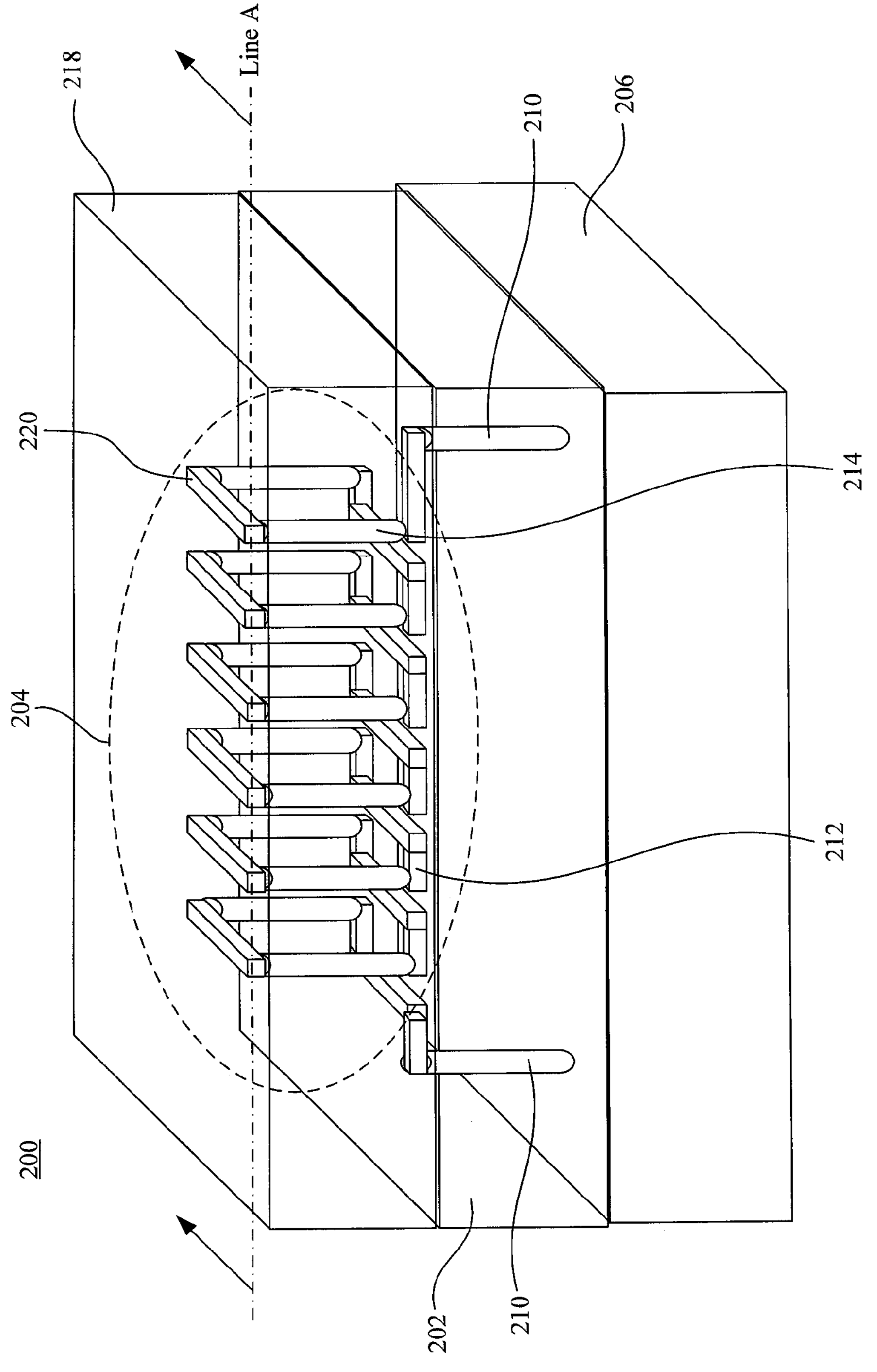
FIG. 2 is a 3-dimensional view of a conductive coil inductor manufactured by the method of a first embodiment of the present invention.
Figures 2A, 2B, 2C:
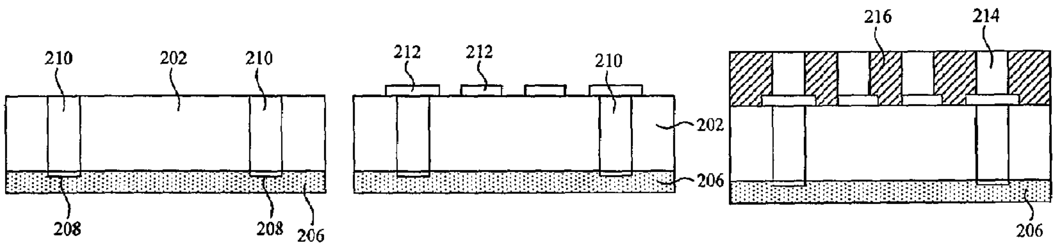
FIG. 2A-2F are cross section views along line A of the conductive coil inductor after each step of manufacturing.

Please refer to FIG. 2, a 3-dimensional view of a conductive coil inductor manufactured by the method of a first embodiment of the present invention. In this embodiment, the conductive coil inductor 200 may be of having a solenoid structure 204 elevated by a first dielectric layer 202 to distance the conductive coil structure 204 from the silicon substrate 206. In FIG. 2A, a cross section view along line A of the conductive coil inductor after the first step of manufacturing is shown. In the first step, a silicon substrate 206 is provided with two terminal contacts 208 thereon. The two terminal contacts 208 may be metal contacts electrically connected to applicable circuitry. Formed on the two terminal contacts 208 are two conductive connectors 210 to electrically connect the terminal contact 208 to the conductive coil structure 204. The two conductive connectors 210 may be formed by a lithography and metal plating process, such as copper plating. A first dielectric layer 202 is formed on the substrate coating the conductive connectors 210. The first dielectric layer 202 may be at least 5 um in thickness so to provide significant distance of separation between the silicon substrate 206 and the conductive coil structure 204. Once the first dielectric layer 202 is established, the conductive coil structure 204 may be formed on top thereof.

Please refer to FIG. 2B, a cross section view along line A of the conductive coil inductor 200 after the second step of manufacturing. The second step of manufacturing includes forming a plurality of conductive bottom structures 212 of the conductive coil structure 204 lying on the first dielectric layer 202. The conductive bottom structures 212 may be metal such as copper plated on top of the first dielectric layer 202 with the two ends of the conductive bottom structures 212 electrically connected to the two conductive connectors 210, respectively. The conductive bottom structures 212 may be better viewed in FIG. 2 where the conductive bottom structures 212 are the bottom side of the conductive coil structure 204 with rectangular shaped coils.

Next, please refer to FIG. 2C, a cross section view along line A of the coil inductor 200 after the third step of manufacturing. A plurality pairs of conductive side structures 214 of the conductive coil structure 204 is formed. Each pair of the conductive side structure stands on top surface of a first end and a second end of each conductive bottom structure 212 and electrically connected therewith respectively. The conductive side structures 214 are formed by first applying a layer of photo resist on top of the first dielectric layer 202. The photo-resist layer may be a dry film resist (DFR) layer. Secondly, pattern the photo-resist to form openings for plating the conductive side structures 214. Lastly, use metal plating such as copper plating to form the conductive side structure 214 in the openings. From FIG. 2, the conductive side structures 214 are the side pillars of the conductive coil structure 204.

Figures 2D, 2E, 2F:
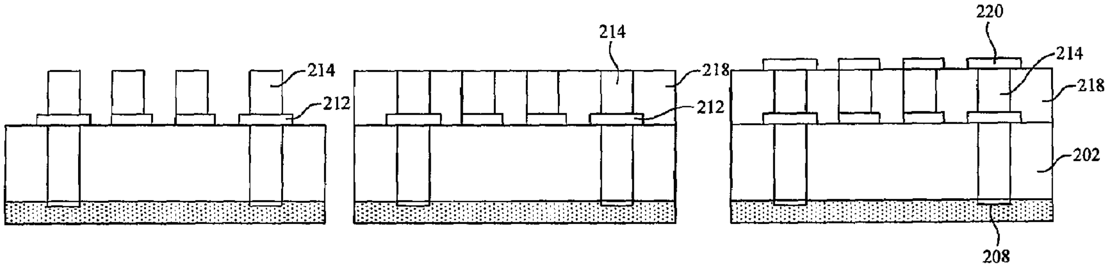

Please refer to FIG. 2D, a cross section view along line A of the conductive coil inductor 200 after the fourth step of manufacturing. In this step, the photo-resist layer is stripped to expose the conductive bottom and side structures 212, 214. In the fifth step, as illustrated in FIG. 2E, a second dielectric layer 218 is coated to cover the conductive bottom and side structures 212, 214 on the first dielectric layer 202. The second dielectric layer 218 may be an epoxy layer. The second dielectric layer 218 is then polished to expose the conductive side structure 214 for electrical connection.

The last step of manufacturing the coil inductor 200, as shown in FIG. 2F, is to form a plurality of conductive top structures 220 of the conductive coil structure 204 on the second dielectric layer 218, which are electrically connected to each pair of the conductive side structures 214. The conductive bottom structures 212, the conductive side structures 214 and the conductive top structures 220 together form the conductive coil structure 204. Therefore, current may flow between the two terminal contacts 208 through the conductive coil structure 204. The conductive top structures 220 are formed by lithography and plating processes, such as applying a photo-resist layer, patterning the photo-resist layer by etching the photo-resist layer, performing metal plating to fill the etched spaces with conductive material, and finally stripping the photo-resist layer. In addition, before forming any conductive structure on top of the first and second dielectric layers 202, 218, a seed layer (not shown) is formed on top of the dielectric layers.

Figure 3:
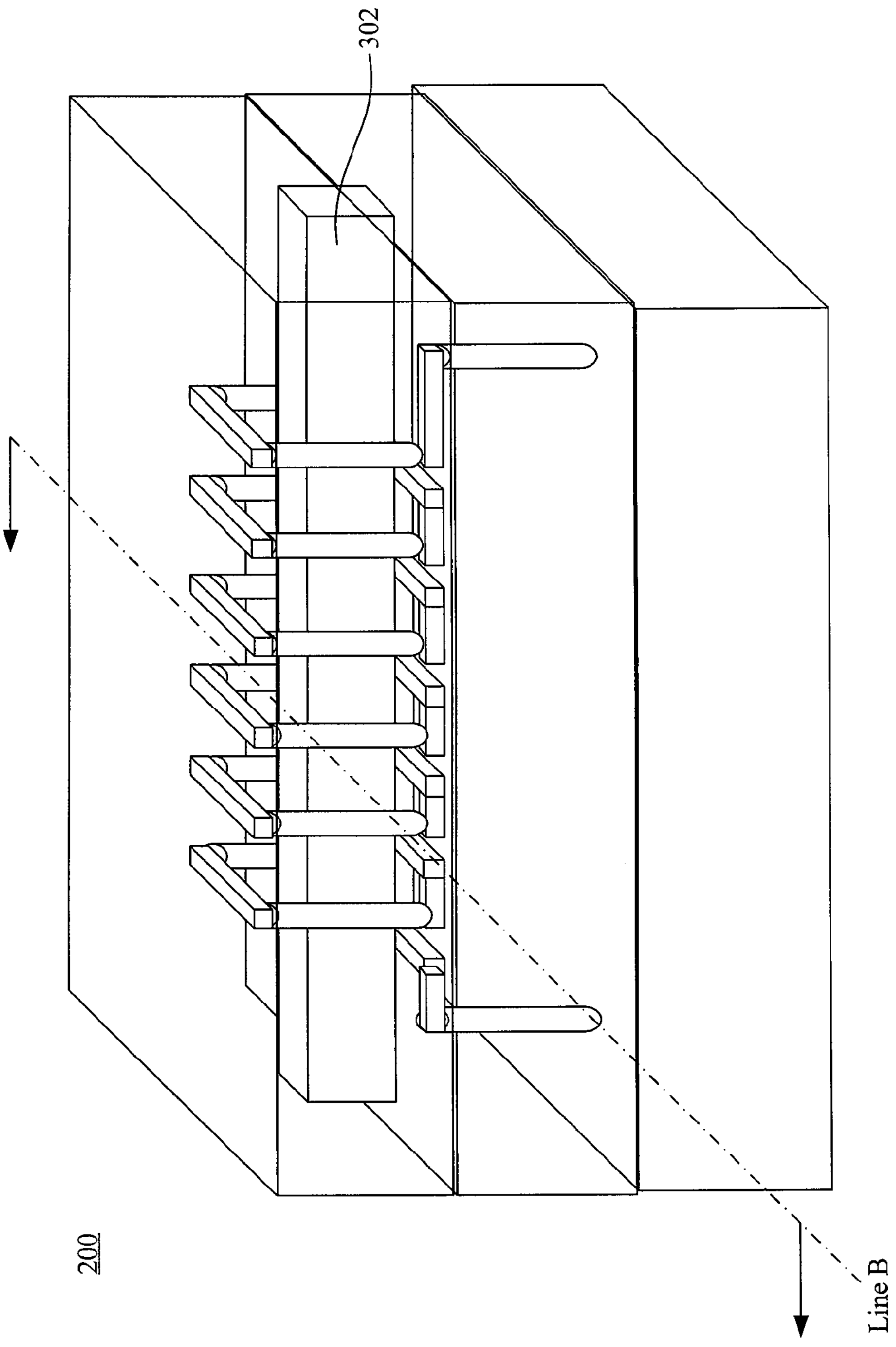
FIG. 3 is a 3-dimensional view of a conductive coil inductor manufactured by the method of a second embodiment of the present invention.

As a second embodiment of the present invention, a ferromagnetic core 302 may be planted into the coil inductor 200. Please refer to FIG. 3, a 3-dimensional view of a coil inductor manufactured by the method of the second embodiment of the present invention. By inserting the ferromagnetic core along the axis of the coil, the inductor value may change according to the permeability of the ferromagnetic core. As the inductance changes, the quality factor of the inductor also changes. A higher quality factor translates to less of an energy loss, which means less energy is wasted by the Eddy current. The relationship may be derived from the following equations:

$$L = \frac{\mu_0 \mu_r N^2 A}{l} \quad (1)$$

$$Q = \frac{\varpi L}{R} \quad (2)$$

where L is the inductance of the coil inductor, $\mu_0$ is the permeability of the free space, $\mu_r$ is the permeability of the ferromagnetic core, N is the number of coils, A is the area of the cross-section of the coil in square meters, l is the length of coil in meters, Q is the quality factor, w is frequency, and R is resistance.

Therefore, if L is increased by inserting a ferromagnetic core with a large permeability, then Q will be increased accordingly. Thus the second embodiment of the present invention shows an example of the method of manufacturing of a coil inductor with a ferromagnetic core 302.

Figure 3A:
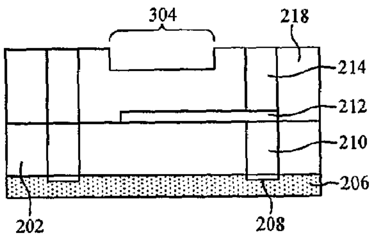
FIG. 3A-3G are cross section views along line B of the conductive coil inductor with a ferromagnetic core after each step of manufacturing.

Please refer to FIG. 3A, a cross-section view of along line B of the coil inductor 200 after the fifth step of manufacturing in the first embodiment of the present invention. The second dielectric layer 218 may be etched to form a trench 304 so to plant the ferromagnetic core 302 therein. This trench is optional and may be omitted and plant the ferromagnetic core 302 directly on the top surface of the second dielectric layer 218.

Figure 3B:
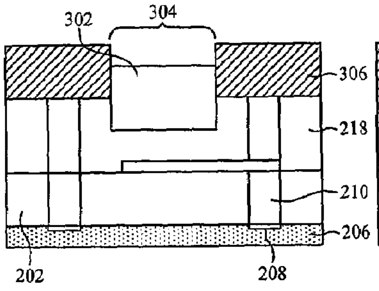

Please refer to FIG. 3B, a cross section view along line B of the coil inductor 200 in the first embodiment of the present invention. A photo-resist layer 306 is applied to the surface of the second dielectric layer 218. The photo-resist layer 306 is then etched above the trench 304 so to expose the trench 304. Furthermore, the ferromagnetic core 302 is planted into the trench 302 by a plating process. The ferromagnetic core 302 may be made of iron, nickel, or cobalt.

Figure 3C:
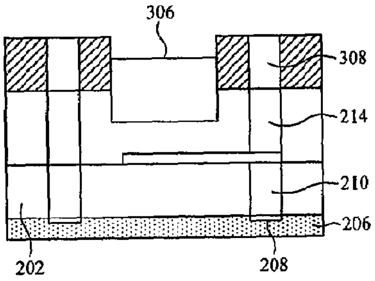

Next step of forming a coil inductor 200 with a ferromagnetic core 302 is illustrated in FIG. 3C, where the photo-resist layer 306 is further etched to expose the conductive side structure 214. A plurality of conductive side structure extensions 308 may be formed in the etched spaces to extend the conductive side structures 214 vertically, so that the height of the conductive side structure extensions 308 may be higher than the height of the ferromagnetic core 306.

Figure 3D:
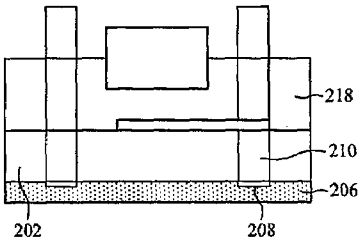

As illustrated in FIG. 3D, the photo-resist layer 306 is then striped. In this step, a seed layer (not shown), which may be disposed on top of the second dielectric layer 218 before the photo-resist layer 306 is applied thereon, may be etched away.

Figure 3E:
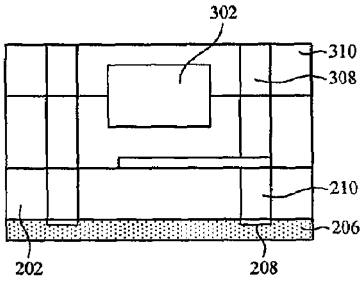

Next, please refer to FIG. 3E, a third dielectric layer 310 may be formed on top of the second dielectric layer 218 to cover the ferromagnetic core material 302 and the conductive side structure extensions 308. The third dielectric layer 310 may be polished to expose the top surface of the conductive side structure extensions 308. The third dielectric layer 310 may be an epoxy layer, which encapsulates the ferromagnetic core 302 along with the second dielectric layer 218. The encapsulated ferromagnetic core 302 is therefore electrically isolated to the conductive coil structure 204.

Figure 3F:
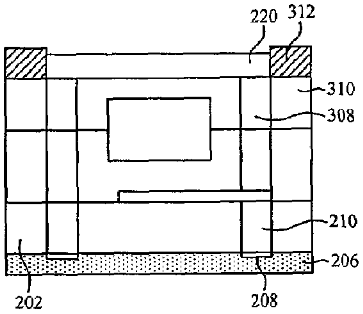

In FIG. 3F, the conductive coil structure 204 is completed by applying a photo-resist later 312 after disposing a seed layer (not shown) on the third dielectric layer 310, which the photo-resist layer 312 is then etched for plating the conductive top structures 220 on top of the third dielectric layer 310. The conductive top structures are electrically connected to the conductive side structure extensions 308.

Figure 3G:
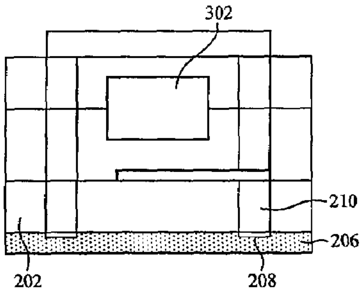

Finally, FIG. 3G illustrates a completed cross section view along line B of the coil inductor 200 with a ferromagnetic core 302 according to the second embodiment of the present invention. The photo-resist layer 312 is stripped and the seed layer (not shown) is etched.

Figure 4:
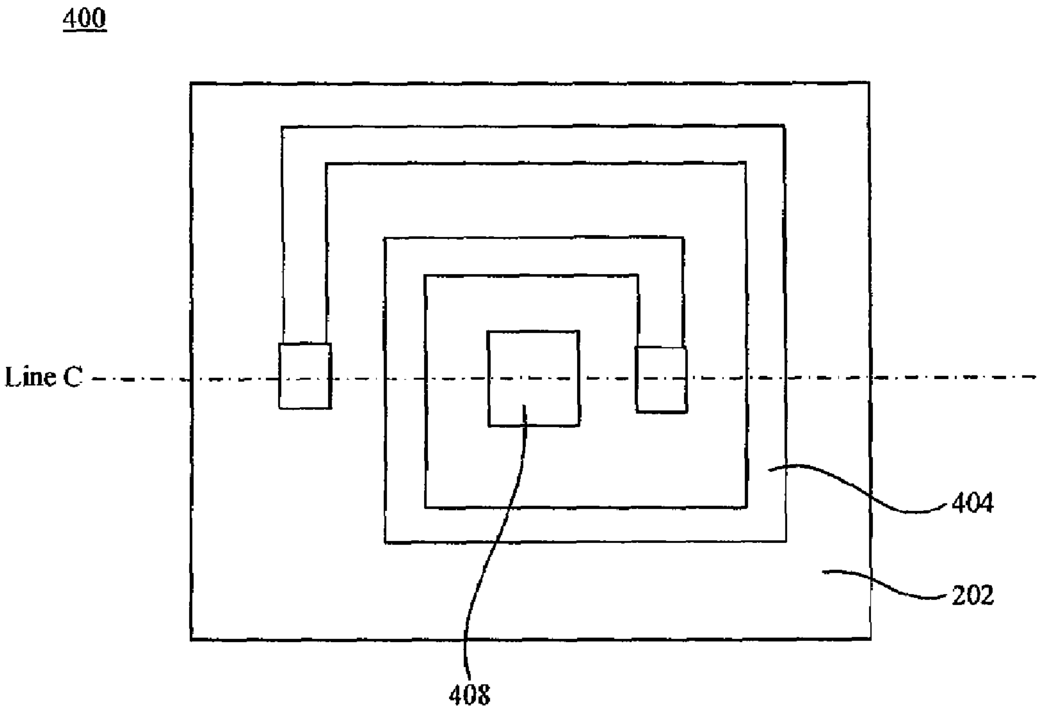
FIG. 4 is a top view of a conductive coil inductor having a conductive spiral structure with a ferromagnetic core according to a third embodiment of the present invention.
Figure 4A:
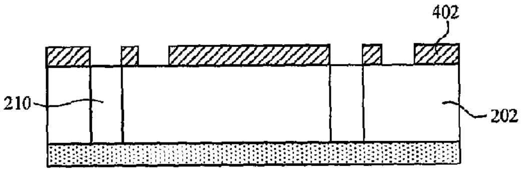
FIG. 4A-4F are cross section views along line C of the conductive coil inductor after each step of manufacturing.

Furthermore, please refer to FIG. 4, a top view of a coil inductor having a conductive spiral structure with a ferromagnetic core 408 according to a third embodiment of the present invention. In this embodiment, the conductive coil structure formed on top of the first dielectric layer 202 is a spiral structure, which may be formed by lithography and plating processes. Please refer to FIG. 4A, a cross section view along line C of the coil inductor 400 after the formation of the conductive connectors 210 and the first dielectric layer 202 according to the third embodiment of the present invention. In this figure, photo-resist layer 402 is applied after a seed layer (not shown) is disposed on the first dielectric layer 202. The photo-resist layer 402 is then patterned so that a portion of the top surface of the first dielectric layer 202 may be exposed for plating a conductive spiral layer 404.

Figure 4B:
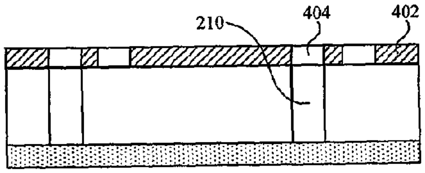
Figure 4C:
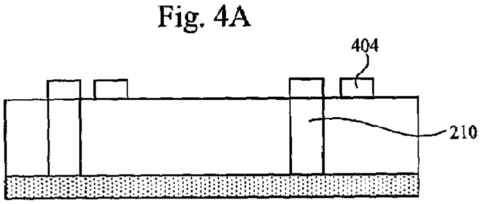

Next, as illustrated in FIG. 4B, the conductive spiral layer 404 may be plated onto the exposed area while electrically connecting the two conductive connectors 210 with each other. In FIG. 4C, the photo-resist layer 402 is removed. If one is to manufacture a coil inductor without a ferromagnetic core, the manufacturing process may be concluded by etching the seed layer. However, when a ferromagnetic core is to be inserted, an additional lithography process is needed.

Figure 4D:
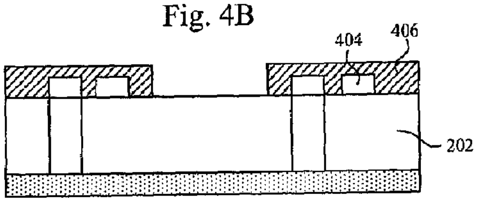

Please refer to FIG. 4D, a photo-resist layer 406 is formed on top of the first dielectric layer 202 and covering the conductive spiral layer 404. The photo-resist layer 406 is then patterned to form an opening at the center of the conductive spiral layer 404.

Figure 4E:
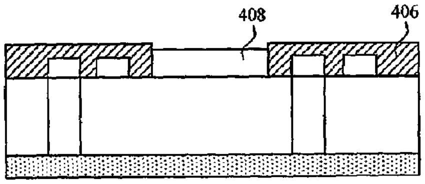
Figure 4F:
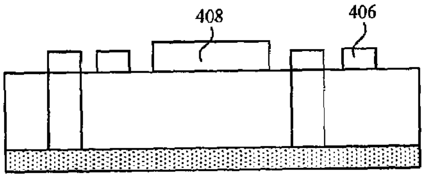

Next, as illustrated in FIG. 4E, a ferromagnetic core 408 is plated into the opening. The ferromagnetic core 408 may be made of iron, nickel, or cobalt. Lastly, as illustrated in FIG. 4F, the photo-resist layer 406 is removed and the seed layer (not shown) is etched to complete the conductive spiral structure forming process.

The above mentioned embodiments of the present invention provided a coil inductor, which induces less Eddy current in the substrate due to the separation distances created by the first dielectric layer 202 and the two conductive pillars 210. Therefore, when the thickness of the first dielectric layer 202 exceeds 5 um, the Eddy current may be reduced significantly in the substrate. A ferromagnetic core may be planted at the center of the coil to provide a higher inductance to the coil inductor and thus further reduces energy loss by the inductor.

Figure 5:
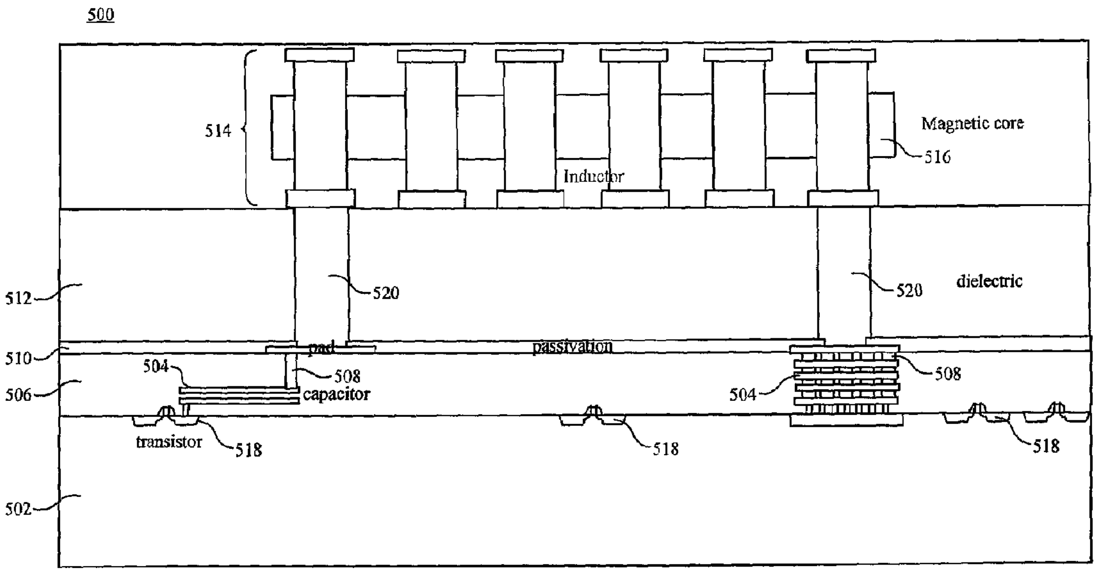
FIG. 5 is a cross section view of an integrated circuit chip.

An example of the coil inductor manufactured in an integrated circuit chip is illustrated in FIG. 5. FIG. 5 shows a cross section view of an integrated circuit chip 500 with a transistor layer 502, metal layers 504, an inter-metal dielectric (IMD) layer 506, interconnects 508, a passivation layer 510, a dielectric layer 512, a conductive coil structure 514, and a ferromagnetic core 516. The transistor layer may be a silicon substrate having transistors 518 fabricated thereon. The transistor 518 may be electrically connected to a capacitor formed by the metal layers 504, which is isolated by the IMD layer 506. The metal layers 504 are connected through the interconnects 508 such as vias and the passivation layer 510 to connect to the conductive connectors 520, which are embedded in the dielectric layer 512. The conductive coil structure 514 is then formed on top of the dielectric layer 512 to form an inductance between the conductive connectors 520. As shown in the previous embodiments, the ferromagnetic core 516 may be planted at the center of the conductive coil structure 514 to enhance the inductance of the coil inductor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a conductive coil inductor, wherein the conductive coil inductor is a solenoid, the method comprises the steps of:

forming a plurality of conductive bottom structures lying on a first dielectric layer;

forming a plurality of pairs of conductive side structures, wherein each pair of the conductive side structure stand on top surface of a first end and a second end of each conductive bottom structure respectively;

forming a second dielectric layer on the first dielectric layer, coating the bottom and side structures; and forming a plurality of conductive top structures lying on the second dielectric layer, wherein each conductive top structure electrically connects each pair of the conductive side structures, wherein the conductive bottom structures, the conductive side structures and the conductive top structures together form a conductive coil structure.

2. The method of claim 1, further comprising the steps of:

providing a silicon substrate; and forming the first dielectric layer on the silicon substrate.

3. The method of claim 2, wherein the silicon substrate has two terminal contacts thereon.

4. The method of claim 3, wherein the two terminal contacts are transfer pads.

5. The method of claim 3, further comprising the steps of:
forming two conductive connectors on the two terminal contacts, wherein two ends of the conductive coil structure is connected to the two conductive connectors.

6. The method of claim 5, wherein the two conductive connectors are formed by a copper plating process.

7. The method of claim 1, wherein the first dielectric layer is at least 5 um in thickness.

8. The method of claim 1, wherein the first dielectric layer is made of epoxy or polyamide.

9. The method of claim 1, wherein the second dielectric layer is made of epoxy or polyamide.

10. The method of claim 1, wherein the plurality of conductive bottom structures, conductive side structures, and conductive top structures are formed by lithography and plating processes.

11. The method of claim 10, wherein the lithography process uses a dry film resist (DFR) layer.

12. The method of claim 10, wherein the plating process is a copper plating process.

13. The method of claim 1, the method further comprises forming a ferromagnetic core at the center of the conductive coil structure.

14. The method of claim 13, wherein the ferromagnetic core is made of iron, nickel, or cobalt.

15. The method of claim 13, wherein the ferromagnetic core is formed by lithography and plating processes after the step of forming the second dielectric layer.

16. The method of claim 15, the method further comprises etching the second dielectric layer to form a trench in the second dielectric layer, so that a portion of the ferromagnetic core is embedded in the trench.

17. A method of manufacturing a conductive coil inductor, wherein the conductive coil inductor is a spiral structure, the method comprises the steps of:
forming a photo-resist layer on top of a first dielectric layer;
patterning the photo-resist layer to form a spiral pattern;
plating a conductive spiral layer on top of the first dielectric layer according to the patterned photo-resist layer;
removing the photo-resist layer; and
forming a ferromagnetic core at the center of the conductive spiral structure.

18. The method of claim 17, further comprising the steps of:
providing a silicon substrate; and
forming the first dielectric layer on the silicon substrate.

19. The method of claim 18, wherein the silicon substrate has two terminal contacts thereon.

20. The method of claim 19, further comprising the steps of:
forming two conductive connectors on the two terminal contacts, wherein two ends of the conductive coil structure are connected to the two conductive connectors.

* * * * *